(12) United States Patent
Esashi et al.

(10) Patent No.: US 6,566,265 B2
(45) Date of Patent: May 20, 2003

(54) METHOD OF WORKING PIEZOELECTRIC SUBSTANCE AND METHOD OF MANUFACTURING COMPOSITE PIEZOELECTRIC SUBSTANCE

(75) Inventors: Masayoshi Esashi, Sendai (JP); Takashi Abe, Sendai (JP); Katsuhiro Wakabayashi, Hachioji (JP)

(73) Assignee: Olympus Optical Co., Ltd., Tokyo (JP)

( * ) Notice: Subject to any disclaimer, the term of this patent is extended or adjusted under 35 U.S.C. 154(b) by 184 days.

(21) Appl. No.: 09/859,844

(22) Filed: May 17, 2001

(65) Prior Publication Data

US 2001/0042291 A1 Nov. 22, 2001

(30) Foreign Application Priority Data

May 18, 2000  (JP) ........................................ 2000-146630

(51) Int. Cl.[7] ........................ H01L 21/302; H01L 41/04
(52) U.S. Cl. ...................... 438/689; 438/706; 310/334; 310/358; 367/140
(58) Field of Search ................................. 438/689, 706, 438/707; 310/320–322, 326, 334, 358; 367/140; 29/25.35, 846–852

(56) References Cited

U.S. PATENT DOCUMENTS 5,164,920 A * 11/1992 Bast et al. .................. 367/140
5,454,146 A * 10/1995 Yagi et al. .................. 29/25.35
5,579,179 A * 11/1996 Ji et al. ....................... 359/846
6,111,818 A * 8/2000 Bowen et al. ............... 367/140

FOREIGN PATENT DOCUMENTS

JP        S60-85699        5/1985

OTHER PUBLICATIONS

"Hand Book of Ultrasonic Diagnostic Equipments", Revised Edition; Nippon Electronic Mechanical Industries Association; Corona Publishing Co., Ltd., 1997, 1/20, pp. 68–74.
"Japan J. Appl. Phys", vol. 36 (1997), pp. 6062–6064.

* cited by examiner

Primary Examiner—Benjamin L. Utech
Assistant Examiner—Duy-Vu Deo
(74) Attorney, Agent, or Firm—Scully, Scott, Murphy & Presser

(57) ABSTRACT

A method of working a piezoelectric substance, which comprises the steps of, forming, on one surface of a piezoelectric block, an etching mask having an aperture which defines a boundary region between a first piezoelectric segment to be removed, and a second piezoelectric segment to be left remained, forming, on the opposite surface of the piezoelectric block, a sacrificial layer which corresponds to the first piezoelectric segment to be removed and the boundary region, etching the piezoelectric block in the boundary region to reach the sacrificial layer, and eliminating the sacrificial layer to remove the first piezoelectric segment.

19 Claims, 8 Drawing Sheets

METHOD OF WORKING PIEZOELECTRIC SUBSTANCE AND METHOD OF MANUFACTURING COMPOSITE PIEZOELECTRIC SUBSTANCE

CROSS-REFERENCE TO RELATED APPLICATIONS

This application is based upon and claims the benefit of priority from the prior Japanese Patent Application No. 2000-146630, filed May 18, 2000, the entire contents of which are incorporated herein by reference.

BACKGROUND OF THE INVENTION

This invention relates to a method of manufacturing a composite piezoelectric substance adapted for use in an ultrasonic probe, etc., and also to a method of working a piezoelectric substance to be employed in the manufacture of a composite piezoelectric substance.

As shown in "Hand Book of Ultrasonic Diagnostic Equipments, Revised Edition; Nippon Electronic Mechanical Industries Association; Corona Publishing Co., Ltd., 1997, 1/20, p68–74", the ultrasonic probe is constructed such that it is mainly consisted of a piezoelectric element, an acoustic matching layer, an acoustic lens and a backing material, all of which are integrated with each other. The piezoelectric element is formed of a piezoelectric ceramic board with electrodes on the opposite surfaces thereof. The acoustic matching layer and the acoustic lens are formed on a side of the piezoelectric element where an ultrasonic wave is transmitted or received. The backing material is formed on the back side of the piezoelectric element.

This ultrasonic probe is operated as follows. A driving pulse of one hundred to several hundreds volts is transmitted from a pulser to the piezoelectric element. Due to this driving pulse, the piezoelectric element is suddenly deformed by a reverse piezoelectric effect. As a result of this deformation, the ultrasonic pulse is excited and emitted via the acoustic matching layer and the acoustic lens.

The ultrasonic pulse thus oscillated is then reflected by an object. The ultrasonic pulse thus reflected re-enters via the acoustic lens and the acoustic matching layer into the piezoelectric element, thus mechanically vibrating the element. This mechanical vibration of the element is converted by way of piezoelectric effect into an electric signal which is then transmitted to a monitoring device and reproduced as an image. The object which reflects the ultrasonic pulse is an interface between tissues of one's body when the pulse is employed for a medical purpose. The object is a discontinuous portion in a measuring object, such as flaw, when the pulse is employed for a non-destructive examination.

Generally, a piezoelectric ceramic is employed for the manufacture of the piezoelectric element of the ultrasonic probe. In recent years, however, a composite piezoelectric transducer using a composite piezoelectric substance consisting of a piezoelectric rod (rod-shaped piezoelectric ceramics) and a resin has been actually utilized as an electromechanical energy transducer for the piezoelectric element.

As set forth in Japanese Patent Unexamined Publication S60-85699 (hereinafter, referred to as a prior art 1), one example of the conventional method of manufacturing the composite piezoelectric substance involves a step of dicing a block-shaped piezoelectric substance (piezoelectric block) to manufacture piezoelectric rods. This method is performed as follows. First of all, a piezoelectric block of, for example, lead zirconate titanate (PZT) is adhered to a substrate with an adhesive. Then, the piezoelectric block on the substrate is diced with a dicing device to obtain a plurality of piezoelectric rods. The groove portion formed as a result of this dicing is filled with a resin such as epoxy resin or urethane resin, and then, the resin is allowed to cure. Finally, the piezoelectric block diced in this manner is removed from the substrate to obtain a composite piezoelectric substance.

More specifically, above mentioned manufacturing method can be performed by two different procedures. One of the procedures involves the steps of completely cutting the piezoelectric block by way of dicing, filling the groove with a resin, curing the resin, and removing the piezoelectric block from the substrate to obtain the composite piezoelectric substance. The other procedure involves the steps of dicing incompletely the piezoelectric block, filling the groove portion with a resin, curing the resin, removing the piezoelectric block from the substrate, and grinding or slicing the piezoelectric block to obtain the composite piezoelectric substance.

Another example of manufacturing method of the composite piezoelectric substance is set forth in "Jpn. J. Appl. Phys."; Vol. 36(1997), pp. 6062–6064 (hereinafter, referred to as a prior art 2). This prior art discloses a method of manufacturing a composite piezoelectric transducer, wherein a deep X-ray lithography and a resin molding method are combined to obtain piezoelectric rods having a high aspect ratio, and then, the space formed between the piezoelectric rods is filled with a resin to obtain the composite piezoelectric transducer.

More specifically, first of all, a resist film having a thickness of 400 $\mu$m and consisting of MMA (methyl methacrylate)/MAA (methacrylic acid) copolymer is deposited on a substrate. Then, a synchrotron radiation is irradiated via a mask onto the resist film, which is followed by the development of the resist film (deep etch X-ray lithography), thereby obtaining a resist structure having a plurality of apertures. Thereafter, a PZT (lead zirconate titanate) slurry is poured into these apertures of the resist structure. The pouring of the PZT slurry, which is consisted of a PZT powder, a binder and water, is performed utilizing the resist structure as a resin mold.

Then, the PZT slurry is allowed to dry and cure at a room temperature to obtain a PZT green body. Then, only the resin mold is removed by means of an oxygen plasma, thus leaving the PZT green body. The PZT green body thus left is next subjected to a defatting treatment (the removal of the binder) at a temperature of 500° C., and then to a main sintering treatment at a temperature of 1,200° C. As a result of the sintering, a PZT rod array consisting of a plurality of PZT rods (piezoelectric columns) each having a dimension of 20 $\mu$m in diameter and 140 $\mu$m in height is obtained.

Then, the space between the PZT rods is filled with epoxy resin by means of vacuum impregnation, which is followed by the curing of the epoxy resin to obtain a composite piezoelectric substance. Thereafter, the top and bottom surfaces of the rod array are polished until the opposite end faces of the PZT rods are exposed. Thereafter, gold electrodes are deposited by means of sputtering on the flattened top and bottom surfaces of the rod array. Thereafter, the rod array is subjected to a poling treatment by impressing a voltage onto the electrodes under the condition wherein the rod array is kept immersed in an oil bath. As a result, a small/thin type composite piezoelectric transducer constituted by a composite piezoelectric substance having a piezoelectric property can be obtained.

However, the aforementioned conventional methods of manufacturing the piezoelectric structure are accompanied with the following problems.

(1) In the method set forth in the prior art 1, if the diameter of the piezoelectric rod is made too small by way of the dicing, the piezoelectric rod may be easily be destroyed during dicing. Therefore, it has been very difficult to obtain a piezoelectric rods of a small diameter, for instance 50 μm or less, so that it has been difficult to manufacture piezoelectric rods of a high aspect ratio. As a result, it has been difficult to manufacture a composite piezoelectric transducer exhibiting a very high oscillating frequency which is required for improving a resolution of a diagnostic apparatus. Further, the piezoelectric rods manufactured by dicing work can only have a configuration of a polygonal cross-section and walls extending straight along a longitudinal axis thereof. Therefore, a redundant oscillation mode in a direction perpendicular to the longitudinal axis can arise in the vicinity of the resonance frequency in the direction of the longitudinal axis of piezoelectric rod, thereby causing noises in the ultrasonic probe.

(2) In the method set forth in the prior art 2, falling-down of the piezoelectric rods during sintering makes it difficult to reduce the diameter of the rods to less than several tens micrometers. Therefore, it has been very difficult to increase the aspect ratio of the rods and therefore to obtain a composite piezoelectric oscillator exhibiting a very high oscillation frequency.

Moreover, the resin mold makes it impossible to utilize a hot press or a hot isostatic press (HIP). Therefore, it has been impossible to highly densify the piezoelectric substance in order to sufficiently utilize its excellent intrinsic properties.

Additionally, it is substantially impossible to apply the method in the prior art 2 to a piezoelectric single crystal.

BRIEF SUMMARY OF THE INVENTION

Therefore, the object of the invention is to provide a method of working a piezoelectric substance to obtain a piezoelectric structure, which is possible to finely work the substance and is also applicable to a piezoelectric single crystal, and a method of manufacturing a composite piezoelectric substance using the piezoelectric structure.

Accordingly, this invention provides a method of working a piezoelectric substance, which comprises the steps of;

forming, on one surface of a piezoelectric block, an etching mask having an aperture which defines a boundary region between a first piezoelectric segment to be removed, and a second piezoelectric segment to be en left remained, forming, on the opposite surface of the piezoelectric block, a sacrificial layer which corresponds to the first piezoelectric segment to be removed and the boundary region, etching the piezoelectric block in the boundary region to reach the sacrificial layer, and eliminating the sacrificial layer to remove the first piezoelectric segment.

This invention also provides a method of manufacturing a composite piezoelectric substance, which comprises the steps of;

forming, on one surface of a piezoelectric block, an etching mask having an aperture which defines a boundary region between a first piezoelectric segment to be removed, and a second piezoelectric segment to be left remained, forming, on the opposite surface of the piezoelectric block, a sacrificial layer which corresponds to the first piezoelectric segment to be removed and the boundary region, etching the piezoelectric block in the boundary region to reach the sacrificial layer, eliminating the sacrificial layer to remove the first piezoelectric segment, filling at least partially a space formed by the removal of the first piezoelectric segment with an organic material, and forming, on the one surface and the opposite surface of the piezoelectric block, electrodes for driving the second piezoelectric segment left remained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
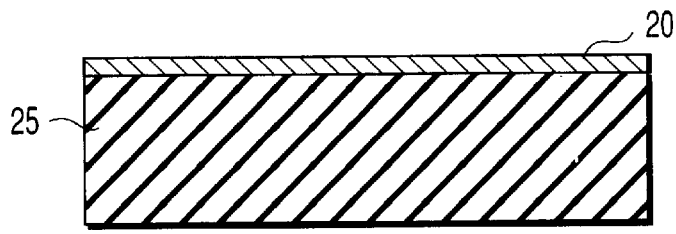
FIGS. 1A to 1M represent cross-sectional views illustrating in stepwise one example of the method of manufacturing a piezoelectric structure and a composite piezoelectric transducer according to this invention.

This invention will be further explained in detail with reference to drawings.

On manufacture of a piezoelectric structure, an etching mask is formed on one surface of a piezoelectric block at first. The mask pattern includes a narrow aperture for partitioning the piezoelectric block into a first piezoelectric segment which is useful, and a second piezoelectric segment which is redundant. The useful segment in this case means a segment which should be left remained as piezoelectric columns, etc. Whereas the redundant segment means a segment which should be removed in order to form a space. In other words, the mask aperture defines a boundary region between the first piezoelectric segment to be removed, and the second piezoelectric segment to be left remained. On the opposite surface of the piezoelectric block, there is formed one or more sacrificial layers. The sacrificial layers are formed so as to correspond to the redundant segments as well as the narrow boundary regions defining the redundant segments. The mask apertures, which define the boundary regions, function to distinguish the redundant segments from the surrounding useful segments. After the sacrificial layers are formed as described above, an etch-stop layer is formed over the opposite surface of the piezoelectric block. The etch-stop layer is formed from a material which can be hardly etched, such as nickel. Further, a supporting substrate is bonded to the etch-stop layer. This supporting substrate is designed to support the etched piezoelectric block. The regions of the piezoelectric block exposed within the mask apertures (boundary regions) are etched with a plasma, for example, so as to divide the piezoelectric block into useful segments and redundant segments. This etching is performed so as to form through-holes passing through the piezoelectric block until reaching the sacrificial layer. The redundant segments of the piezoelectric block are mounted on the sacrificial layers. Finally, the sacrificial layers are eliminated by means of etching or by making use of a releasing solution, to remove the redundant segments together with the sacrificial layers. Thus, the piezoelectric structure is obtained.

Being different from a piezoelectric material of thin film deposited on a substrate, the piezoelectric block is solely manufactured from a piezoelectric material through molding and sintering steps. The piezoelectric block can be formed from a piezoelectric ceramic material. The piezoelectric ceramic materials exhibiting excellent piezoelectric properties include a piezoelectric ceramic material and a piezoelectric single crystal which respectively consists of at least three kinds of element. In particular, piezoelectric materials containing lead element are especially preferable.

Examples of such piezoelectric materials include piezoelectric ceramics such as lead zirconate titanate (PZT type) $Pb(Zr, Ti)O_3$, lead magnesium niobate-lead titanate (PMN—PT type) $\{Pb(Mg, Nb)O_3—PbTiO_3\}$, lead zinc niobate-lead titanate (PZN—PT type) $\{Pb(Zn, Nb)O_3 PbTiO_3\}$, and single crystals such as a single crystal of PZN—PT type solid solution, a PMN—PT type single crystal, or a potassium niobate ($KNbO_3$) plate-shaped single crystal cut out at an angle of 44 degrees relative to the polarization axis.

If the potassium niobate single crystal is worked into a rod-shaped piezoelectric substance, it exhibits excellent piezoelectric properties. Such a piezoelectric single crystal can provide a composite piezoelectric transducer exhibiting a very excellent piezoelectric properties, resulting in that the S/N ratio of the final ultrasonic probe can be increased, thereby achieving a high resolvability. Since the piezoelectric single crystal is very brittle depending on the combination between the stress to be applied and the crystal orientation, it is very difficult to suitably work the piezoelectric single crystal. However, if an optimized etching condition is selected, the piezoelectric single crystal can be etched at a high speed to manufacture a composite piezoelectric transducer consisting of fine piezoelectric columns, etc. The etching condition can be optimized by suitably selecting a reactive gas which enables a reaction product to be easily evaporated and is capable of providing a large bombardment. It is possible, by making use of the same procedures in this manner, to perform a high-speed etching of not only the piezoelectric single crystal but also the aforementioned various materials.

The etching mask to be deposited on the piezoelectric block can be deposited using any kind of material and any film-forming method which can realize a smaller selectivity ratio of the mask during plasma etching than that of the piezoelectric material (i.e. the etching rate of the mask is smaller than that of the piezoelectric material). For example, materials deposited by CVD such as silicon oxide ($SiO_2$), silicon nitride ($Si_3N_4$) and calcium fluoride ($CaF_2$); materials deposited by electrolytic plating such as nickel (Ni) and copper (Cu); and a resinous resist itself can be used.

The etching mask may be formed in such a manner that a conductive mask such as Ni is deposited at first and then, a material which can be easily charged up such as quartz ($SiO_2$) is deposited up to several hundreds nanometers on the conductive mask by means of sputtering for instance. When the etching mask is formed in this manner, the mask is charged up during the plasma etching thereof, thereby causing the incoming ions to deflect so as to make it possible to effectively adjust the profile of etching surface.

It is also possible to prepare a stencil mask in advance so as to make it available as an etching mask. In this case, since good or bad finishing of etching can be determined by judging only the features of the mask, it is possible to improve the yield.

As for the configuration of the piezoelectric column, etc. to be fabricated by the etching, it may be hexagonal or any other polygonal configuration in cross-section other than the columnar configuration. Further, the layout of the piezoelectric columns may not be regular. The distance between neighboring piezoelectric columns should better be non-uniform in view of alleviating the oscillation in the horizontal direction which may become a cause for the noise.

The mask pattern can be determined depending on the configuration and dimension of the piezoelectric columns to be manufactured. For example, the mask pattern can have ring-shaped apertures, each having the same diameter as that of each of the columnar piezoelectric rods to be left after etching. The dimension of mask pattern, such as the ring diameter, depends on the diameter of the columnar piezoelectric rod.

In view of facilitating the removal of the redundant segments of the piezoelectric block, it is preferable to form slits having a width of several micrometers in the mask pattern so as to partition each segment into a plurality of sub-segments, thereby improving the yield.

The width of the mask aperture (where the piezoelectric substance is exposed and etched) should preferably be 20 $\mu$m or less. Generally, it is difficult to perpendicularly etch the piezoelectric substance, the sidewall of the etched piezoelectric column etc. being tapered. However, if the width of the mask aperture is narrowed as described above, the piezoelectric substance can be approximately perpendicularly etched (this perpendicular etching differs more or less for different kinds of piezoelectric material, depending on etching conditions such as the kind of reactive gas, the pressure of chamber during the etching, the etching temperature, as well as the volatility of reaction products during etching). The taper angles of the sidewall after etching largely depends on the mask aperture width, so that if the mask aperture with is narrowed suitably, the taper angle tends to become 90 degrees, thus making it possible to perform a perpendicular etching. This dependency on the mask aperture width can be attributed to the volatility of reaction products during etching and to the cohesive strength of atoms or molecules of piezoelectric materials. Namely, the lower the volatility of materials in the piezoelectric material is, the narrower the aperture width should be in order to perform a perpendicular etching. A perpendicular etching can keep the etch width narrow, thereby forming a piezoelectric column of a high aspect ratio.

More specifically, it is preferable that the width of aperture of mask is restricted to not more than 10 μm in addition to the optimization of etching conditions on the occasion of etching a piezoelectric material which tends to be tapered by the etching. If, for instance, the width of aperture of mask is set to 3 μm, almost all kinds of piezoelectric material can be perpendicularly etched.

In particular, when the piezoelectric material consists of three or more kinds of elements as described above, the kinds of reaction products would increase in proportion to an increase in kind of the constituent elements, thereby making it more difficult to perform a perpendicular etching. If it is desired to obtain a desired fine piezoelectric structure from a piezoelectric block consisting of three or more kinds of elements, the peripheral portion of each of the redundant segments of piezoelectric block is preferably perpendicularly etched away through the aforementioned mask apertures of narrow width followed by removing the redundant segments.

For example, when the piezoelectric material is formed of $KNbO_3$, the width of mask aperture should preferably be limited to the range of not more than several micrometers to not more than ten-odd micrometers. On the other hand, when the piezoelectric material is formed of PZT type ceramics, the width of mask aperture should preferably be limited to the range of 2 to 3 micrometers or less. Further, if quartz crystal is to be etched according to the method of this invention, the width of mask aperture should preferably be limited to not more than 20 micrometers.

Since the angle of tapering of sidewall would become larger as the width of mask aperture is increased, if it is desired to provide the sidewall of the etched piezoelectric column with a suitable angle of tapering, the width of mask aperture can be increased in conformity with the configuration of the desired piezoelectric column.

When the etching is performed under the condition where the width of mask aperture is sufficiently narrowed, it is not only possible to execute a perpendicular etching to thereby obtain a piezoelectric column of high aspect ratio, but also possible to reduce the quantity to be etched of piezoelectric block. As a result, the deposit of the reaction products in the etching apparatus can be reduced to thereby facilitate the maintenance of the etching apparatus. Since a heavy metal such as lead is generally included in the piezoelectric material and halogen is included in the etching gas, a reaction product is inevitably included in the exhaust gas discharged from the etching apparatus. However, since the quantity of the piezoelectric block to be etched away is minimized, the content of the reaction products in the exhaust gas and the use of the etching gas can be minimized. This is important in respect of preserving the environments.

Further, in the case of providing different sizes of spaces between the piezoelectric columns, a micro-loading effect during etching (the effect that the etching rate is dependent on the width of etching) can be extremely minimized. This may be attributed to the fact that only a narrow through-groove is formed by etching at the periphery of each segment to be removed to provide spaces, so that the width of etching is constantly kept narrow for different sizes of the spaces between columns. Furthermore, the etch-stop layer (which will be explained hereinafter) can be formed to correspond only to the segments to be removed and their peripheral through-holes (in the same way as the sacrificial layer) without corresponding to the piezoelectric columns. This results in a minimum size of the etch-stop layer, making the process efficient.

The aforementioned technique of perpendicular etching of the piezoelectric substance in the mask aperture of narrow width can be applied not only to a block-shaped piezoelectric material but also to a thin-film piezoelectric material.

After an etching mask is formed as described above, one or more sacrificial layers consisting of silicon for instance is formed on the rear surface of the piezoelectric block (the lower surface of the block). The sacrificial layers are deposited to correspond to the redundant segments of the piezoelectric substance to be removed as well as the narrow mask apertures distinguishing the redundant segments from the other necessary segments. The sacrificial layers are not confined to silicon but may be any kind of materials removable without a damage to the piezoelectric substance. For example, the layer can be made from an organic material such as a photoresist which can be removed with an organic solvent and is compatible with a sputtering and plating.

After the deposition of the sacrificial layer, an etch-stop layer is deposited by sputtering on the lower surface of the piezoelectric block where the sacrificial layer has been deposited. This etch-stop layer is formed of any materials which can be hardly etched away during plasma etching. For example, nickel or any other kinds of material which can be utilized as an etching mask material can be employed. In the same way as in the etching mask, a material which is capable of exhibiting a smaller selectivity ratio as compared with the piezoelectric material during plasma etching may be employed. The etch-stop layer can correct any differences in etching rate due to a non-uniformity of etching which may be caused by an etching apparatus. The method of depositing the etch-stop layer is not confined to the sputtering method, but various kinds of vapor deposition method or the same procedures as applicable to the deposition of the etching mask as mentioned above can be employed.

A supporting substrate is then bonded to the lower surface of the piezoelectric block provided in advance with the etch-stop layer. For example, a supporting substrate made of the same kind of ceramics as employed for the piezoelectric block can be bonded to the lower surface with a bonding agent such as an indium-based alloy which can be fused at a relatively low temperature. The material for the supporting substrate can be any kinds of material which are incapable of raising any problem during plasma etching, it is preferable to employ the same kind of material as that of the piezoelectric block. This can minimize the generation of stress because a less difference in thermal expansion coefficient occurs between the piezoelectric substance and the supporting substrate during plasma-etching at the elevated temperature of the block. As a result, the possibility of peeling at the bonded portion between the piezoelectric substance and the supporting substrate can be minimized. The etch-stop layer can be formed of other kinds of material exhibiting almost the same level of thermal expansion coefficient as that of the piezoelectric substance, such as a 42 alloy or glass of low thermal expansion coefficient.

After the supporting substrate is assembled in this manner, the regions of the piezoelectric substance exposed within the mask aperture are etched away by plasma for instance, down to a depth reaching the sacrificial layer, thereby forming through-holes. The through-holes can separate the block into two groups of segments, one group to be left remained, and another group to be removed.

The etching method using plasma is well known as a dry etching method in the field of Si processing. Unlike the materials such as Si and $SiO_2$ employed in the Si processing, the piezoelectric material contains components which result in a reaction product which can be hardly volatilized. Suitable selection of reactive gas is very important to enhance the etching rate and to improve the profile of the sidewall. Specifically, gases (halogen including chlorine) which are capable of generating a reaction product of a high vapor pressure through a reaction with a constituent element of the piezoelectric substance is very effective as a reactive gas in this regard.

More specifically, the etching can be performed by means of a reactive ion etching method using an inductively coupled plasma (ICP-RIE), or a parallel plate reactive ion etching method.

The reactive gases to be employed in the etching can be sulfur hexafluoride ($SF_6$) gas, or a mixed gas comprising $SF_6$ gas and at least one additional gas selected from the group consisting of oxygen and inert gases (argon (Ar), krypton (Kr), xenon (Xe), etc.). It is also preferable to employ a chlorine-based gas such as a single chlorine gas, a mixed gas consisting of a chlorine-based gas and a fluorine-based gas such as carbon fluoride ($CF_4$), or a mixed gas consisting of a chlorine-based gas and a gas containing a substance (Kr, Xe, etc.) which is capable of giving an ion of large molecular weight or large atomic weight in the plasma. The reason is that these gases can provide a large etching rate and can realize an easy control of the angle of tapering of sidewall of the etched piezoelectric column. Namely, chlorine or fluorine in the gas contribute to the chemical etching, whereas the ion having a large molecular weight or a large atomic weight in the plasma contributes to the physical etching. More specifically, when the self-bias is increased, the ion of this kind can increase the bombardment speed or the energy of the bombardment against the piezoelectric block of a material to be etched, then the physical etching being promoted.

When an inert gas is mixed into an $SF_6$ gas or a chlorine-based gas, the plasma can be stabilized. In particular, Kr and Xe can contribute to the stabilization of plasma under a low pressure in addition to the contribution to the physical etching.

These etching gases and a gas (such as $C_4F_8$) which can form a deposit on the etching surface may be alternately introduced to be formed into a plasma, thereby repeating the etching and the deposition so as to control the taper angles.

When a chlorine-based gas is to be employed as an etching gas, the etching apparatus is required to be constituted by a material which is excellent in corrosion resistance.

The etching work of the piezoelectric block should preferably be performed in a pressure of not more than 20 mTorr. This is because lower pressure can decrease the number of bombardments between the ions and other kinds of molecules, thereby enhancing the physical etching rate. Furthermore, lower pressure can volatilize the reaction products more easily during etching because of the reaction between the ions or radicals and the piezoelectric substance, thereby enhancing the etching rate.

The temperature of specimens during etching should preferably be higher than room temperature in view of enhancing the productivity. Since the actual piezoelectric substance can include at least three kinds of additives such as Mn, Co, Ni, W, etc., the reaction products generated during etching can include various kinds of material. If the piezoelectric substance includes additives which can result in reaction products of low volatility, such reaction products will deposit during an etching at a low temperature, thereby obstructing the high-speed etching. The etching at a temperature higher than room temperature can suppress the deposition of reaction products, thereby increasing the etching rate and realizing a perpendicular etching relative to the main surface of the piezoelectric block. For example, in the case of the PZT where many kinds of additives are included therein, the temperature of the specimens should preferably be controlled in the range of 50 to 300° C.

The plasma density should preferably be as high as possible for the purpose of achieving a high-speed etching work. For example, the high-frequency, power applied to a plasma-generating coil should be higher than 100W. For the purpose of enhancing the plasma density, the gap between the stage and the inner wall (for example, a quartz plate) of reaction vessel facing the stage should be as narrow as possible (specifically, 50 mm or less).

The AC voltage applied to the stage should preferably be as high as possible to enhance the etching rate so as to improve the productivity. Specifically, the AC voltage should preferably be applied to make a self bias not higher than −300V. Even if the power source for the stage is a high-frequency power source (13.56 MHz), which is the same as the power source for the coil, in place of the low frequency power source of several hundreds KHz, the etching can be performed in almost the same manner. A lower frequency voltage can preferably be applied to the stage to make the slower switching between the positive and negative voltages of the stage, thereby increasing the ion bombardment. As a result, the contribution of physical etching becomes larger, thereby enhancing the etching rate as compared with the case where a high-frequency power source is employed. Additionally, since the quantity of deposit can be minimized, it becomes possible to obtain a more excellent etching profile. Furthermore, use of a low frequency power source for the power source for the stage can result in repetitions between an etching with negative ions and an etching with positive ions, thereby further enhancing the etching rate.

For the purpose of controlling the configuration of the sidewall after the etching, the high-frequency voltage should preferably intermittently applied to the sample mounting stage. The intermittent application of the high-frequency voltage can improve the angle of the sidewall, which may vary depending on the piezoelectric materials, without interrupting the plasma. This is especially effective in the case where the insulative piezoelectric substance is charged up, and preventing the ions from being perpendicular incident on the piezoelectric substance. Further, an intermittent application of the voltage to the stage facilitates the reaction products to be discharged from the chamber to prevent them being accumulated therein, thereby making it possible to reduce the quantity of the deposit to be formed inside the chamber.

A high-frequency voltage may be applied to the stage which is already applied a positive voltage, thereby keeping the stage positive and performing the etching utilizing negative ions. Use of negative ions consisting mainly of halogens can perform an etching of an enhanced selectivity to the mask, even though the etching rate may be somewhat sacrificed.

The etching may be performed with varied etching conditions so as to provide the sidewalls of the piezoelectric substance with suitable taper angles. The tapered sidewall can minimized the redundant oscillation mode in the radial direction of the piezoelectric column, thereby making it possible to manufacture a probe having an improved S/N ratio and an improved sensitivity. Furthermore, the tapered sidewall can alter only the array pitch of the piezoelectric substances (with the different sizes of the resin portion).

The next step is, as described above, to eliminate the sacrificial layer after the plasma etching. Together with the sacrificial layer, the redundant segments of piezoelectric substance mounted on the sacrificial layer are removed to leave the piezoelectric columns of desired configuration, thus manufacturing a piezoelectric structure. The spaces formed after the removal of the piezoelectric substance are filled with a resin as explained hereinafter.

Where the sacrificial layer consists of Si, the etching thereof can be performed by making use of $XeF_2$ (xenon fluoride). Other than the etching method using $XeF_2$, any kinds of etching method can be employed which are capable of etching Si without any substantial damage to the piezoelectric substance. When the etching method using $XeF_2$ is employed, the etching rate for materials other than Si is much slower than that for Si. Even the ordinary epoxy resin cannot be substantially etched away by $XeF_2$, so that only Si can be etched away by $XF_2$ with excellent selectivity. As described above, when an organic material such as a resist is employed for the sacrificial layer, the sacrificial layer can be removed by immersing it in an organic solvent such as acetone or in a releasing agent dedicated for the resist, or by exposing it to an oxygen plasma.

After the piezoelectric structure is manufactured by removing the sacrificial layer with redundant segments of the piezoelectric substance, the spaces such as grooves or holes formed by the removal of the redundant segments of the substance are filled with organic materials. The organic materials can be any ones which have a high adhesive strength to the piezoelectric columns, although flexible organic materials are preferable. Examples of such flexible organic materials include epoxy resin, urethane resin, silicone resin.

Even if the spaces are not completely filled with a resin, spaces partially filled with a resin can also provide the characteristics of a composite piezoelectric transducer. The air left in the spaces where the resin is not filled can minimized the cross-talk between the neighboring piezoelectric rods, and can lower the acoustic impedance to improve the permeability of the ultrasound into the human body. Thus, the picture quality in an ultrasonic diagnostic apparatus is expected to be improved.

After the filling of the resin in the spaces, the electrodes for driving the piezoelectric columns are formed on the upper and lower surfaces of the piezoelectric block. The electrode material can be any material which will not give any substantial damage to the organic materials during the electrodes formation. Examples of such an electrode material include metals such as gold, copper, titanium, nickel, silver, platinum, chromium, and combination thereof such as a laminated metal of a chromium/gold, for example, and compound materials such as ITO (indium tin oxide). The method of forming the electrodes can be sputtering, vapor deposition, ion plating.

As a final step, the external profile of the specimen is worked to accomplish the composite piezoelectric transducer.

According to the working method of the piezoelectric structure of this invention, a block-shaped piezoelectric substance exhibiting excellent piezoelectric properties is worked, so that it is possible to obtain a piezoelectric column of high aspect ratio, which is excellent in piezoelectric properties and has a fine and high-precision configuration. The piezoelectric column of a fine and high-precision configuration can allow the composite piezoelectric transducer to be easily miniaturized. Furthermore, the aspect ratio of the piezoelectric column is sufficiently high, so that the transmitting and receiving properties of the composite piezoelectric transducer can be improved, whereby the S/N ratio of transmitting and receiving signals can be enhanced.

Since the piezoelectric structure is fabricated by means of dry etching method, the inclusion of oily components or contaminants into the structure can be extremely minimized as compared with the case where the piezoelectric structure is fabricated by means of mechanical working, thereby making it possible to improve the adhesivity between the resin and the piezoelectric columns.

Further, since the piezoelectric block is subjected to fine working by means of dry etching, a single crystal piezoelectric substance (which is difficult to be subjected to a mechanical working such as dicing and is impossible to be worked with a lost mold process utilizing LIGA etc.) can be easily worked.

As explained above, the etching conditions can be adjusted to provide the sidewall of the piezoelectric column with suitable taper angles. As a result, the redundant vibration mode in the radial direction of the piezoelectric column can be minimized as mentioned above, so that it is possible to manufacture a probe having an improved S/N ratio and an enhanced sensitivity.

Next, a first embodiment of the method according to this invention will be explained with reference to FIGS. 1A to 1M.

The manufacturing method according to this embodiment comprises steps of: (1) manufacturing a piezoelectric block; (2) forming a mask on the piezoelectric block; (3) etching the piezoelectric block; (4) removing redundant elements of piezoelectric block; (5) filling an organic material; and (6) polishing, providing electrodes and providing piezoelectricity.

(1) A Step of Manufacturing a Piezoelectric Block:

A block-shaped piezoelectric substance (piezoelectric block) is prepared at first by means of ordinary method. For example, a mixed powder of a desired composition is preliminarily baked, pulverized, mixed with a binder in order to improve the moldability, graded to obtain a graded mixture, and molded into pellets by means of pressing method. The pellets are then heated at a temperature of 600° C. to remove organic substances remaining therein. Thereafter, the pellets are subjected to a hot press at a temperature of 1,200° C. to obtain a sintered body. The sintered body is then shaped using a slicer, a surface grinder, and, if required, a double lapping machine thereby to obtain a piezoelectric block 25 as shown in FIG. 1A, which is subsequently subjected to the etching work. If a PZT-based material is employed for example as a piezoelectric material, it is possible to employ a material having frequency constants of: Nt=about 2000 Hz-m, and N33=about 1300 Hz-m. In this case, if the thickness of the piezoelectric block 25 is set to 0.1 mm, the resonance frequency of rod vibration to which N33 is applicable would become 13 MHz.

(2) A Step of Forming a Mask on the Piezoelectric Block:

As shown in FIG. 1A, chromium (Cr) and gold (Au) are successively deposited by means of sputtering on the surface of the piezoelectric block 25 to thereby form a thin film electrode 20.

Figure 1B:
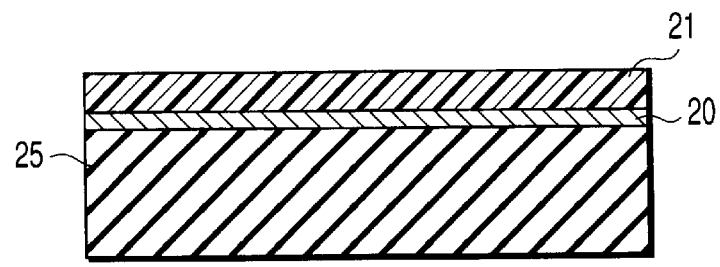

Then, as shown in FIG. 1B, a photoresist layer is coated on the Cr/Au electrode 20 to form a resist layer 21.

Figure 1C:
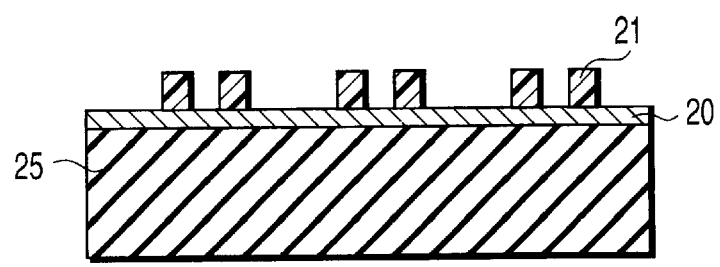

As shown in FIG. 1C, the photoresist layer 21 is subjected to a patterning exposure so as to leave the resist along the boundaries between the piezoelectric segments to be ultimately left as piezoelectric columns and the piezoelectric segments to be removed for filling a resin therein. The photoresist layer 21 is subsequently subjected to the development step to thereby obtain a patterned photoresist layer 21. The pattern of the resist layer 21 can include a plurality of ring-shaped resist layers each having a diameter corresponding to the diameter of the piezoelectric columns (columnar piezoelectric substances) and a width ranging from 1 to 3 μm.

Figure 1D:
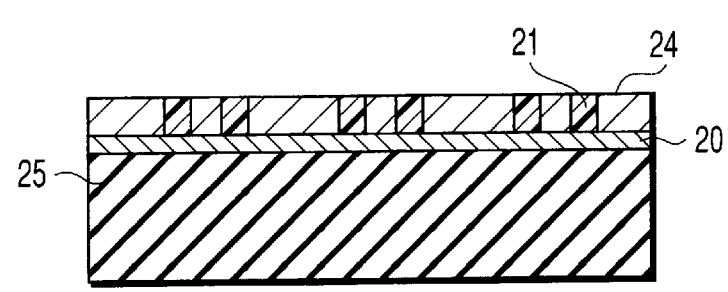

Next, as shown in FIG. 1D, the electrolytic plating of nickel (in a sulfamic acid bath) is performed by applying a negative voltage to the Cr/Au electrode 20 to thereby form a nickel film, thus obtaining a pattern of nickel 24.

Figure 1E:
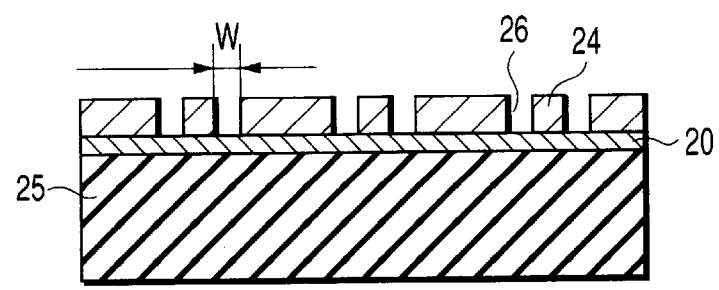

Then, as shown in FIG. 1E, the resist layer 21 is removed using a solvent, thereby obtaining a piezoelectric block 25 bearing the residual nickel mask 24. This pattern of nickel 24 is formed of a pattern having ring-shaped apertures 26 having an aperture width W ranging from 1 to 3 μm in conformity with the ring-shaped resist 21 left remained as shown in FIG. 1C.

Figure 1F:
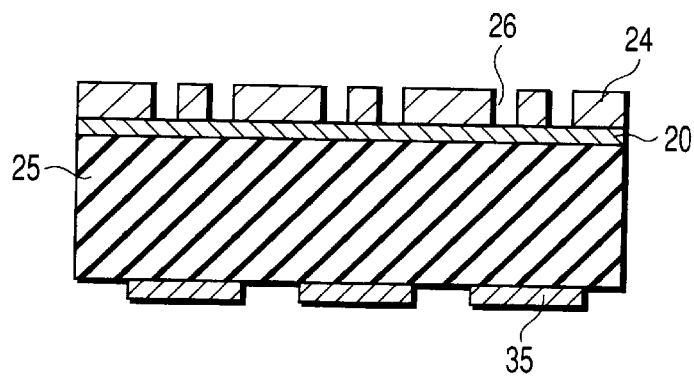

Then, as shown in FIG. 1F, sacrificial layers 35 consisting of silicon are formed on the lower surface of the piezoelectric block in conformity with the piezoelectric segments to be removed and with the apertures 26 which define boundary regions between segments to be removed and regions to be left. This silicon layer 35 can be patterned by making use of photolithography. For example, a resist film is coated on the lower surface of the piezoelectric block 25 and then, patterned. Then, a silicon layer is formed by means of sputtering method, and the resist film is removed (lift-off) to form a pattern of silicon.

Figure 1G:
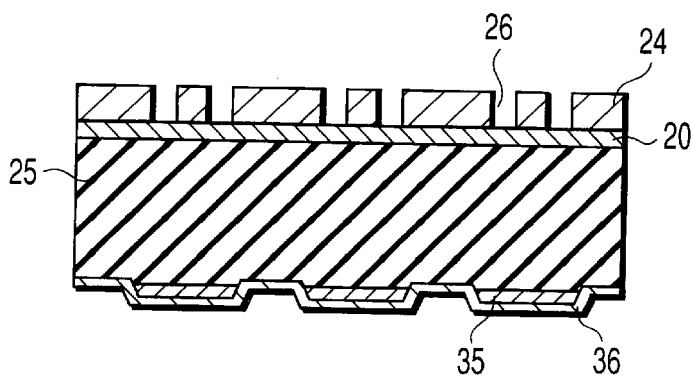

Next, as shown in FIG. 1G, as an etch-stop layer, a nickel layer 36 which can be hardly etched away during the plasma etching is formed all over the lower surface of the piezoelectric block by means of sputtering.

Figure 1H:
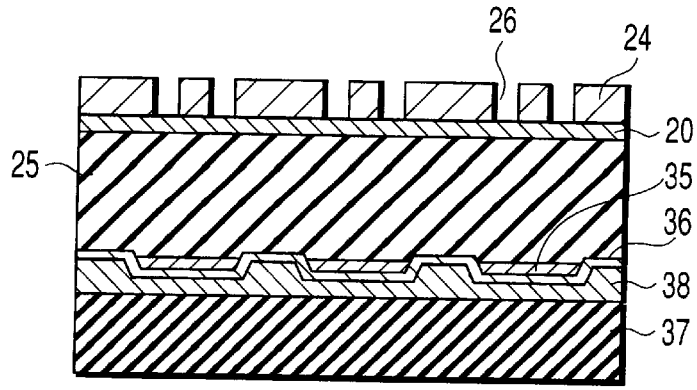

Finally, as shown in FIG. 1H, a supporting substrate 37 consisting of the same kind of ceramics as that of the piezoelectric block 25 is bonded to the lower surface of the piezoelectric block 25 by making use of a bonding agent 38 comprising an indium-based alloy which can be fused at a relatively low temperature.

Figure 1I:
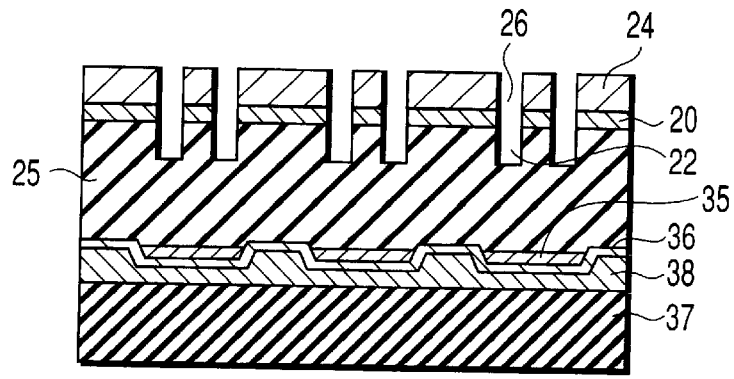

(3) A Step of Etching the Piezoelectric Block:

As shown in FIG. 1I, the piezoelectric block 25 is perpendicularly plasma-etched according to the mask pattern of the nickel layer 24 to thereby form holes or grooves 22 in the piezoelectric block 25. This etching can be performed by way of a reactive ion etching employing inductively coupled plasma (ICP-RIE) method wherein $SF_6$ is employed as a reactive gas.

Figure 2:
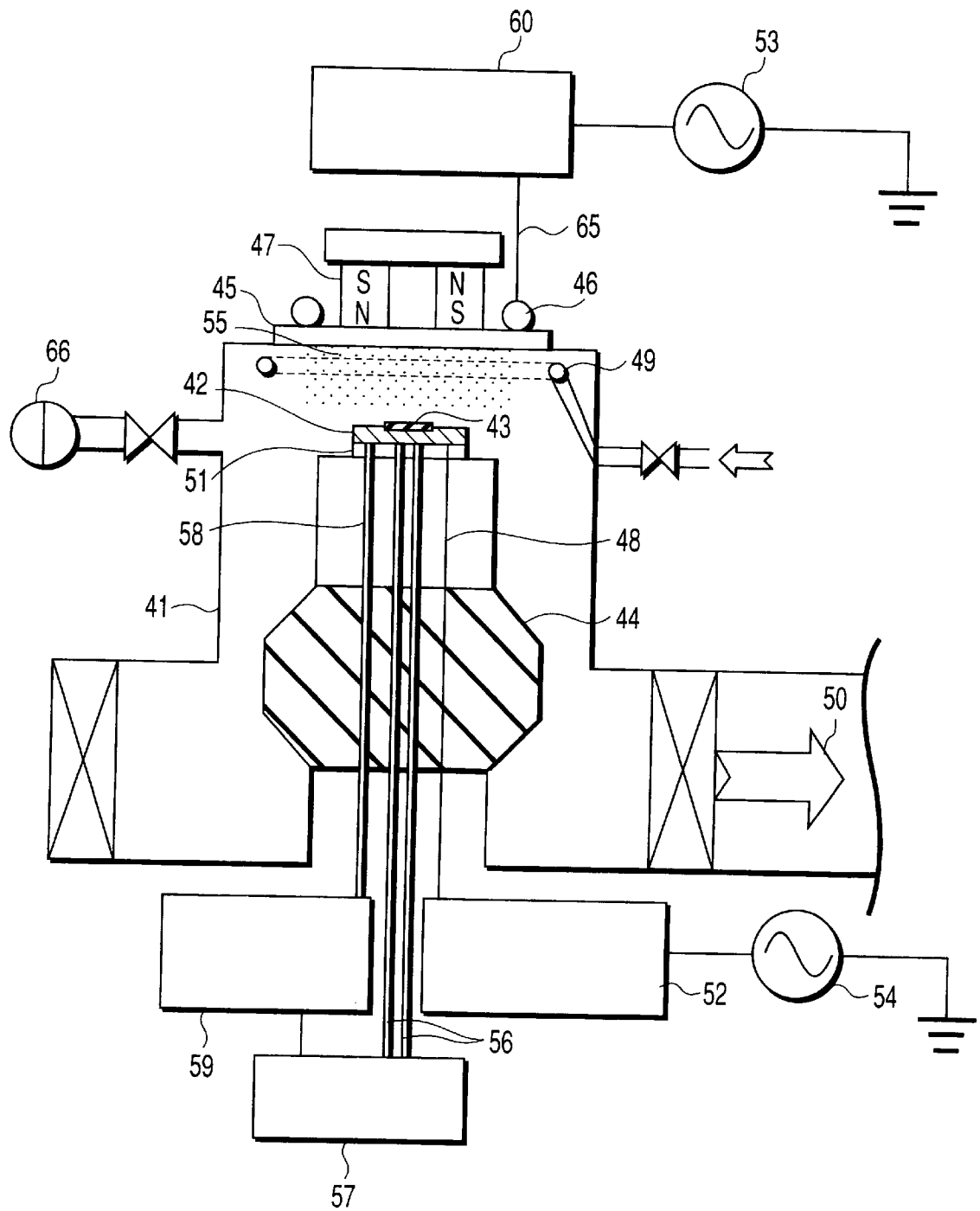
FIG. 2 is a schematic view showing one example of the ICP-RIE device according to this invention.

FIG. 2 shows a schematic view of a plasma etching apparatus suited for the etching process. Referring to FIG. 2, a stage 42 for mounting a sample 43 thereon is disposed inside the aluminum chamber 41 (if a chlorine-based gas is employed, SUS such as SUS316 which is in corrosion resistance is employed). This stage 42 is provided with a heater 51 for heating the stage 42 and with a connecting pipe 56 for passing a cooling medium to the interior of the stage 42, thereby making it possible to control the temperature of the stage 42. This connecting pipe 56 is connected with a coolant-cooling apparatus 57 which is controlled by a temperature controller 59. Further, the stage 42 is also provided with a thermocouple 58 which is connected with the temperature controller 59. The stage 42 is electrically insulated from the chamber 41 by way of an insulator 44, thereby making it possible to apply a high-frequency voltage to the stage 42. Further, the stage 42 is connected via a lead wire 48 with an external matching box 52 which is connected with a low frequency power source 54 (about 700 kHz).

A lid 45 placed on the top of the chamber 41 is made from sapphire glass, and a one-turn type inductive coil 46 wherein a cooling water is allowed to pass therethrough is placed on the lid 45 (on the atmosphere side). A permanent magnet 47 of NbFeB attached to a magnetic body is centered in the coil 46. This coil 46 is connected via a lead wire 65 with a matching box 60 which is connected with an RF power source 53 (13.56 MHz) for applying a high-frequency voltage.

The reactive gas is uniformly introduced into the chamber 41 through a ring-shaped inlet pipe 49 disposed above the stage 42. The pressure inside the chamber 41 is maintained constant by means of a manometer 66 attached to the chamber 41. A high-frequency current of 13.56 MHz for instance generated from the RF power source 53 is allowed to pass through the coil 46 so as to cause a plasma 55 to be generated and maintained thereat. The chamber 41 can be evacuated with a turbo-molecular pump 50 for instance. An etching apparatus capable of evacuating the chamber 41 at a large flow rate per unit time can minimize the residence time of the gas, thereby effectively exhausting the reaction products from the chamber 41. Therefore, such an etching apparatus would be excellent in the respects that the etching rate can be accelerated and that the etching treatment can be performed in large quantities at the same time.

Figure 1J:
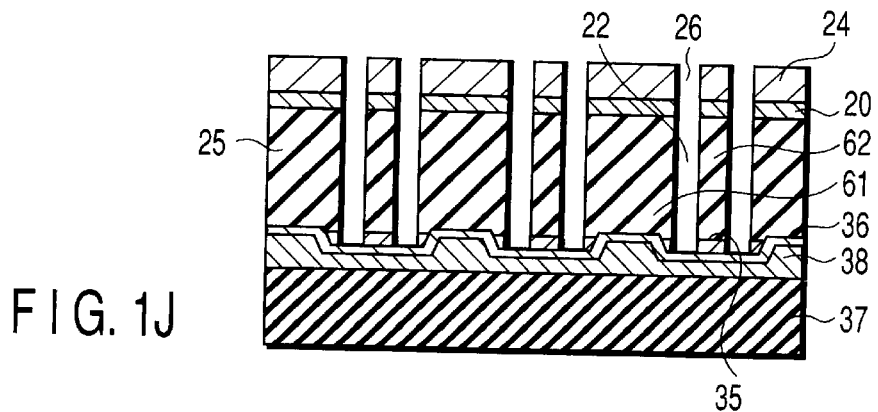

As shown in FIGS. 1I and 1J, a deep hole or groove 22 can be formed by suitably adjusting the etching conditions such as the temperature of the substrate 43, the pressure inside the chamber 41, the low-frequency output applied to the stage 42 and the high-frequency output applied to the coil 46.

As shown in FIG. 1J, the etching is performed down to a depth reaching the silicon layer 35, thereby forming through-holes or grooves 22 which penetrates through the piezoelectric block 25. With the provision of the through-holes or grooves 22, the piezoelectric block 25 is separated into the segments 61 of the block to be left and the redundant segments 62 of the block to be removed. Further, when the pattern of the resist layer 21 shown in FIG. 1C is changed as desired, the configuration of the piezoelectric column 61 shown in FIG. 1J can be variously altered other than the columnar configuration.

Figure 3:
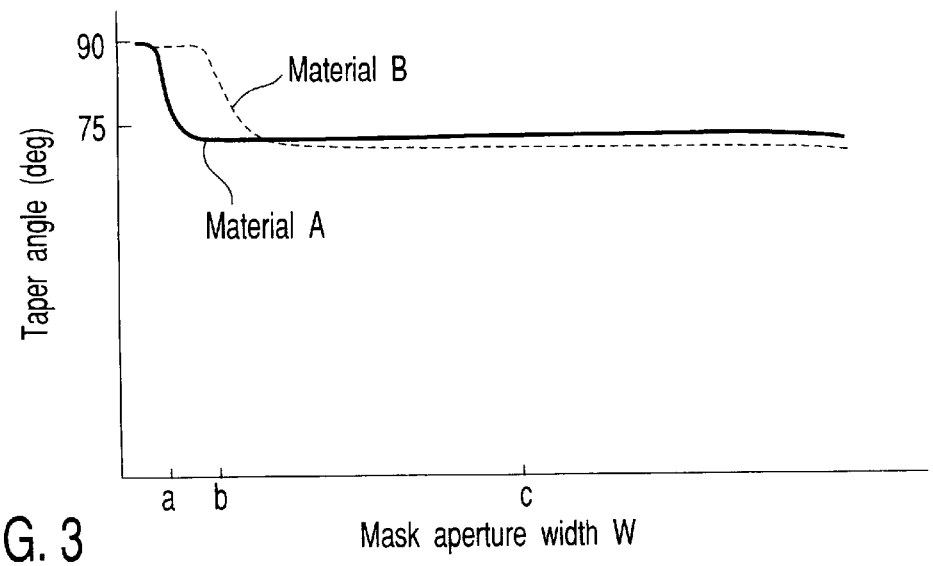
FIG. 3 is a graph showing one example of the dependency of a sidewall taper angles on the make aperture width according to this invention.

As explained above, the sidewall of the piezoelectric column 61 can be tapered at a desired angle depending on the aperture width W (shown in FIG. 1E) of the etching mask 24. FIG. 3 represents one example of the dependency of the taper angle on the width of mask aperture. This dependency varies for different kind of piezoelectric material depending on etching conditions such as the kind of reactive gas, the pressure inside the chamber during the etching, the etching temperature, as well as on the volatility of reaction products during etching. For example, as shown in FIG. 3, the piezoelectric material A can be substantially perpendicularly etched for the aperture width W less than "a". Whereas the piezoelectric material B can be substantially perpendicularly etched for the aperture width W less than "b", ("b" is larger than "a"). This material A can be PZT, and the width "a" can be 2 to 3 μm, and the width "b" can be about 20 μm. As explained above, the aperture width W should preferably be not more than 20 μm to perform the perpendicular etching.

Figure 1K:
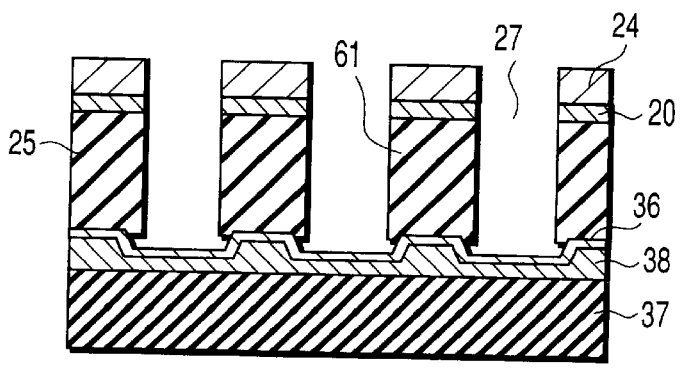

(4) A Step of Removing Redundant Segments of Piezoelectric Block:

As shown in FIG. 1K, spaces 27 are formed in the piezoelectric block 25 by removing the redundant segments 62 of the piezoelectric block 25. More specifically, the silicon layer 36 is selectively etched away with $XeF_2$ gas to thereby remove the segments 62 of the piezoelectric block 25 disposed on the silicon layer 36. In this case, the etching gas can enter from the surface of the piezoelectric block 25 to reach the silicon layer 36 through the holes or grooves 22 to thereby etch and remove the silicon layer 36. As described above, $XeF_2$ shows a much slower etching rate for the materials other than Si as compared with the etching rate for Si, so that the silicon layer 36 can be exclusively etched away with excellent selectivity.

Figure 1L:
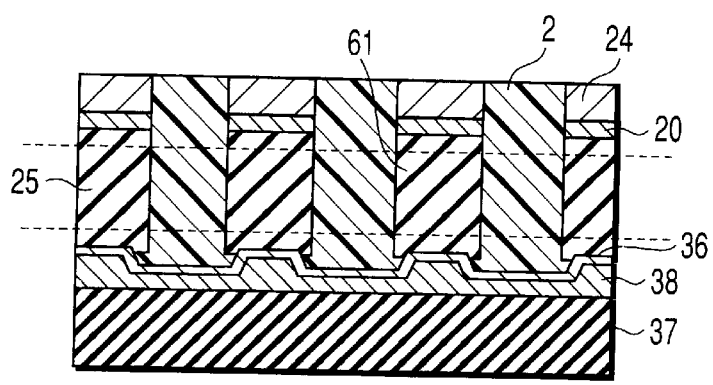

(5) A Step of Filling an Organic Material:

As shown in FIG. 1L, the spaces 27 are filled with an organic material 2. The organic material 2 can be filled in such a way that the sample shown in FIG. 1K is placed inside a closed vessel, and, while evacuating the vessel, the organic material 2 is introduced into the vessel through an another inlet port attached to the vessel, thereby filling the spaces 27 with the organic material 2. The organic material 2 thus introduced into the vacant portions 27 is subsequently heated to cure.

(6) Steps of Polishing, Providing Electrodes and Providing Piezoelectricity:

The piezoelectric block 25 filled with the organic material 2 is abraded and polished from the surface thereof to an extent indicated by a broken line A as shown in FIG. 1L to expose both of the piezoelectric column 61 and the organic material 2. The resultant composite substance consisting of the piezoelectric column 61 and the organic material 2 can have a thickness of about 65 $\mu$m.

Figure 1M:
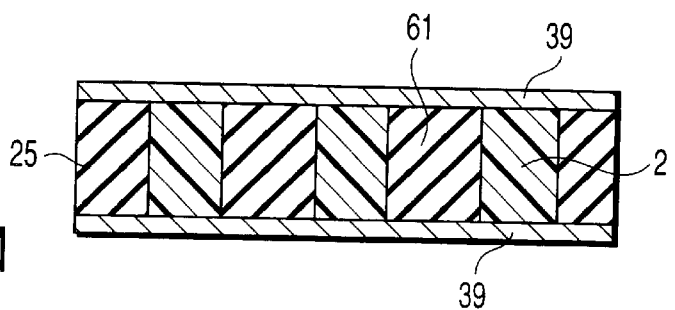

Then, as shown in FIG. 1M, electrodes 39 are deposited on the top and lower surfaces of the sample where the piezoelectric column 61 and the organic material 2 are both exposed. Thereafter, a DC voltage is applied between the electrodes 39 to execute the poling treatment of the piezoelectric substance 25 to provide the substance 25 with piezoelectricity. Finally, the shaping work of the sample is performed to accomplish the composite piezoelectric transducer. Although the poling treatment is performed as the final process in this embodiment, this treatment may be performed when manufacturing the piezoelectric block. Care should be taken in this case such that in the subsequent steps after the poling treatment, the piezoelectric substance should not be heated up to the vicinity of Curie point thereof, thereby preventing the piezoelectricity thereof from being deteriorated.

Figure 4:
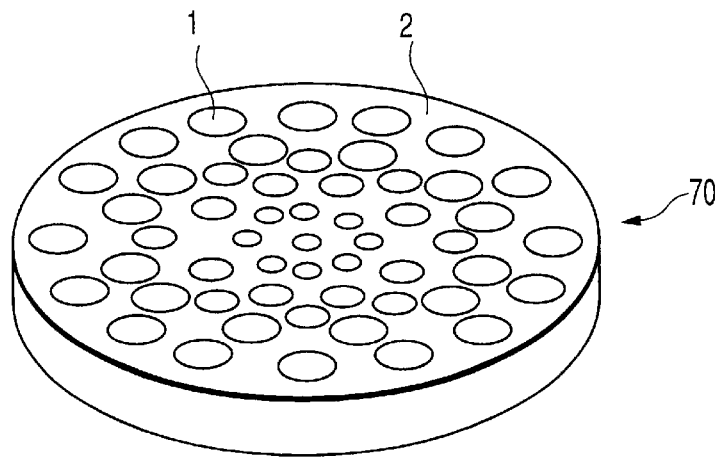
FIG. 4 illustrates a perspective view schematically showing one example of a composite piezoelectric transducer according to this invention.

FIG. 4 shows one example of the composite piezoelectric transducer prepared as described above, wherein a perspective view schematically illustrating the composite piezoelectric transducer of 1-3 structure according to this first embodiment is shown. This 1-3 structure means a structure wherein the piezoelectric substances are extending one-dimensionally in a longitudinal direction, while the resin elements are extending three-dimensionally. Namely, the composite piezoelectric substance consisting of a piezoelectric substance and a resin can be classified by the number of the dimension (direction) in which each component is extending, i.e. the composite piezoelectric substance can be represented by: (the number of dimension in which the piezoelectric substances are extending)—(the number of dimension in which the resin components are extending).

The composite piezoelectric transducer 70 shown in FIG. 4 comprises a plurality of piezoelectric columns 1 disposed parallel with each other, an organic material 2 filled in the spaces between piezoelectric columns 1, and electrodes (not shown) formed on the top and lower surfaces, including the both end faces of each piezoelectric column 1.

A plurality of piezoelectric columns 1 are spaced apart with their longitudinal axes in parallel. Each column 1 has a first and second end faces, which are substantially perpendicular to the longitudinal axis thereof. The organic material 2 is filled in the spaces between the piezoelectric columns 1 so as to expose the first and second end faces. The electrodes have a first electrode which is in contact with the organic material 2 and the first end face, and a second electrode which is in contact with the organic material 2 and the second end face.

Since the sidewall of the piezoelectric column 1 is worked using a plasma dry etching method as described above, the sidewall can be kept clean without cut chips or oily matters adhered, and the surface thereof is modified. Thus, the adhesion strength can be enhanced between the piezoelectric column 1 and the resin. The enhanced adhesion strength can improve the bending strength of the resultant composite piezoelectric transducer, and can provide a composite piezoelectric transducer having a complicated configuration such as a concaved shape. Since the mechanical strength of the composite piezoelectric transducer can be improved, it is possible to improve the durability of the final ultrasonic probe.

Figure 5:
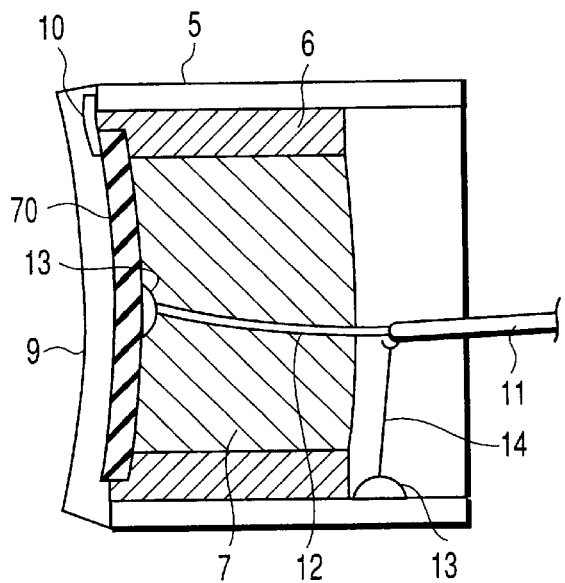
FIG. 5 is a perspective view schematically showing one example of a distal end portion of an ultrasonic probe according to this invention.

FIG. 5 shows a cross-sectional view schematically illustrating one example of a distal end portion of an ultrasonic probe manufactured with the composite piezoelectric transducer 70 shown in FIG. 4.

The ultrasonic probe shown in FIG. 5 is constructed as follows. An insulating pipe 6 is adhered to the inner surface of a conductive housing 5, and a backing material 7 is filled in the insulating pipe 6. The composite piezoelectric transducer 70 having a curvature is fixed to the front face of the backing material 7. An acoustic matching layer 9 is attached to the composite piezoelectric transducer 70 on the front face thereof which is designed to be an acoustic radiating face. Further, the front face of the composite piezoelectric transducer 70 for the acoustic radiating side is connected, through a conductive resin or a combination of a solder and a lead wire 10, with the housing 5. The back face (designed to be a signal side) of the composite piezoelectric transducer 70 is connected, through a low temperature solder 13, with a signal wire of external lead wire 11. The GND (ground) wire 14 of the lead wire 11 is connected, through a low temperature solder 13, with the housing 5.

The ultrasonic probe in FIG. 5 has the composite piezoelectric transducer 70 which is manufactured by making use of a plurality of piezoelectric columns 1 each having a cleaned sidewall which is designed to be contacted with a resin as shown in FIG. 4. As a result, the composite piezoelectric transducer 70 has a high adhesivity with the resin 2, and a high durability and a high resolution due to a high aspect ratio.

In the ultrasonic probe shown in FIG. 5, a low temperature solder 13 is employed for the electrical connection between the composite piezoelectric transducer 70 and the signal line 12, and between the housing 5 and the GND wire 14, although it is possible to employ a conductive resin, a sputtering method or a vapor deposition method for these electrical connections.

Although a plasma etching is employed in the etching step in the present embodiment, the etching may be performed using other kinds of etching other than the plasma etching. For example, an etching using a femto-second laser, or an etching using the bombardment of ionized cluster may be employed.

Next, a second embodiment according to this invention will be explained with reference to FIGS. 6A to 6D, 7, 8A and 8B. The same members or elements as those in the first embodiment will be identified by the same reference numerals, and, only different features from the first embodiment will be mainly explained.

The steps prior to the plasma etching in the manufacturing method according to this embodiment are the same as those in the first embodiment shown in FIGS. 1A to 1H. Namely, a piezoelectric block is prepared, and a Cr/Au electrode as an underlying layer is formed on one surface of the piezoelectric block, after which a resist is coated and subjected to the steps of patterning exposure/development. Then, a nickel layer is formed by means of plating, and the resist layer is removed to form a nickel mask. Thereafter, a sacrificial layer 35 and an etch-stop layer 36 are formed on the other surface of the piezoelectric block. Finally, a supporting substrate 37 is bonded to the other surface, thereby making it ready for the plasma etching step.

As a material for the piezoelectric block 25 employed in this embodiment, a potassium niobate ($KNbO_3$) plate which has been cut out at an angle of 44 degrees relative to the polarization axis is employed. Chromium (Cr) and then gold (Au) are successively deposited by means of sputtering on one surface of the piezoelectric block 25 to thereby form a thin film. A film of nickel is then deposited on the thin film by means of plating while passing a pulse current to the plating bath. Since nickel is pulse-plated in this manner, it is possible to enhance the etching selectivity during the plasma etching using a nickel mask. Further, since the surface of the nickel mask can be made uniform, it is possible to prevent the piezoelectric column from being tapered during the etching.

The sacrificial layer 35 is formed by making use of a resist. The etch-stop layer 36 is formed in such a manner that after the deposition of an Au/Cr thin film, a nickel layer (3 $\mu$m in thickness) is formed, as the etch-stop layer 36, in a nickel sulfamate bath.

Figure 6A:
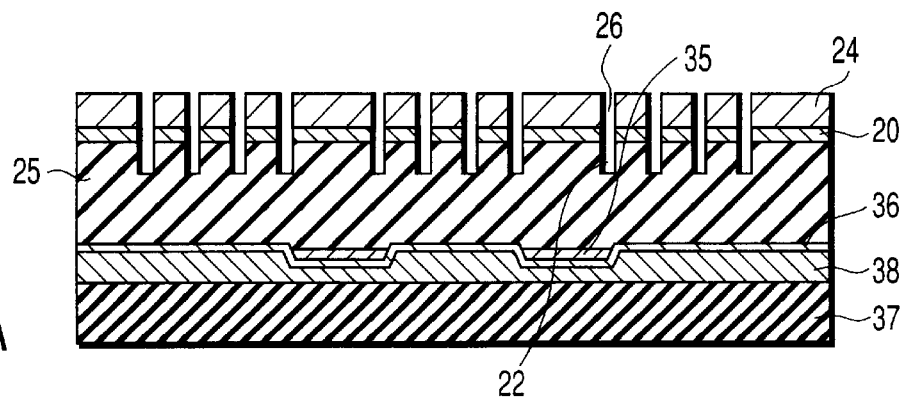
FIGS. 6A to 6D respectively shows another example of the method of manufacturing a piezoelectric structure and a composite piezoelectric transducer according to this invention.
Figure 6B:
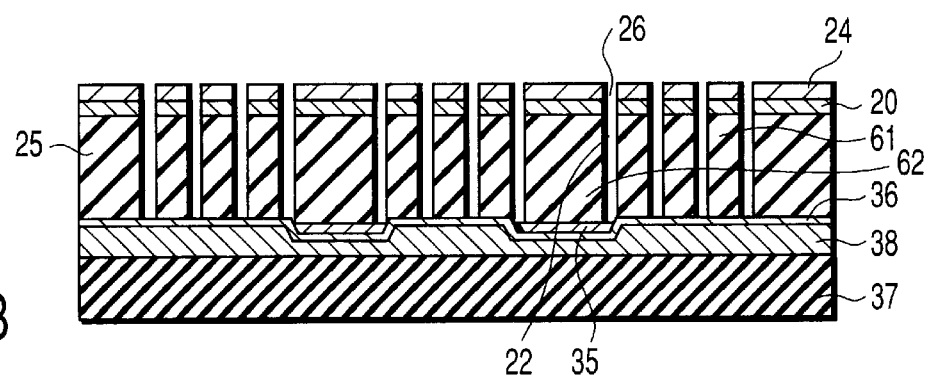

As shown in FIGS. 6A and 6B, a plurality of piezoelectric columns 61 and 62 are formed by means of plasma etching. As for the reactive gas for the etching, a mixed gas comprising a Cl gas and a $CF_4$ gas can be employed. The etching is continued until it reaches the resist layer 35 that has been formed in advance.

Figure 6C:
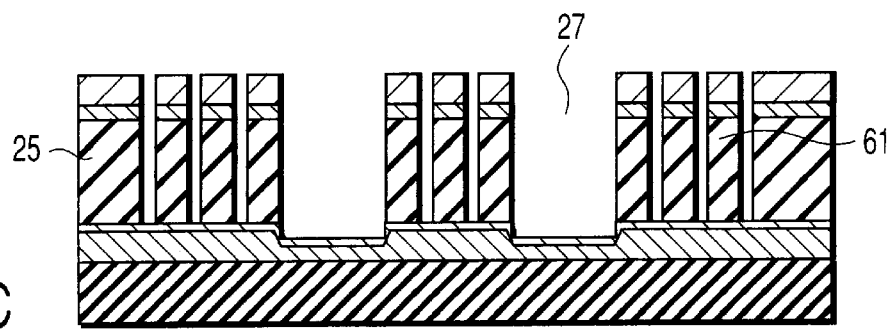

As shown in FIG. 6C, the sample is immersed in acetone or a releasing solution exclusively adapted for the resist to thereby remove the resist layer 35 and redundant segments of the piezoelectric columns 62, thus obtaining a piezoelectric structure.

Figure 6D:
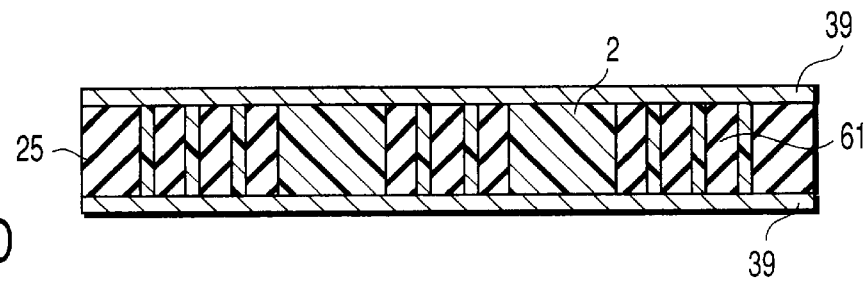

As shown in FIG. 6D, the sample is cleaned by making use of an oxygen plasma, and then, epoxy resin 2 having a Shore hardness A90 or so after a curing thereof at room temperature is filled in a space between neighboring piezoelectric columns 61. Then, both surfaces of the sample are abraded so as to expose the resin 2 and the group of piezoelectric columns 61. Then, the resultant surface exposing the resin 2 and the piezoelectric columns 61 is cleaned by means of an UV treatment or an oxygen plasma, and then, electrodes 39 are formed on the cleaned surface.

Figure 7:
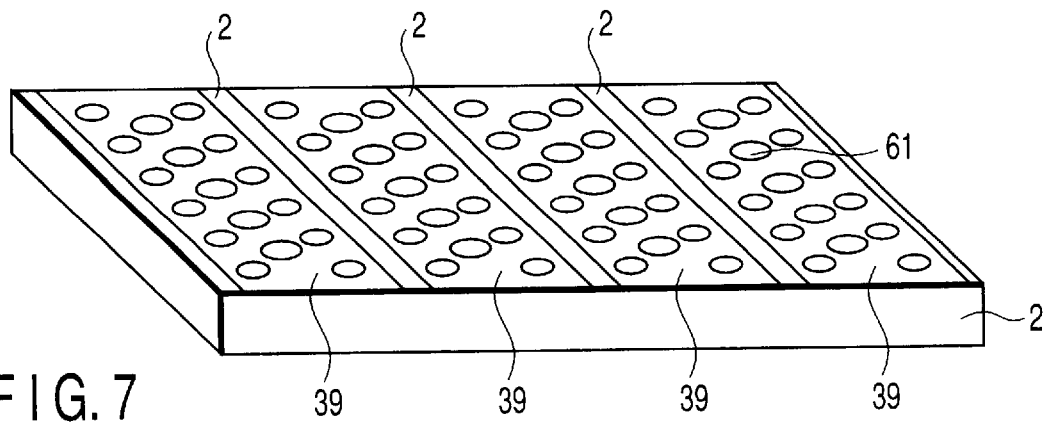
FIG. 7 shows a perspective view schematically showing another example of a composite piezoelectric transducer according to this invention.

FIG. 7 shows a perspective view schematically illustrating one example of the composite piezoelectric transducer of a 1-3 structure (the piezoelectric substances are one-dimensionally or longitudinally extending, while the resin elements are three-dimensionally extending) which has been prepared as described above.

As shown in FIG. 7, a plurality of piezoelectric columns 61 are spaced apart with their longitudinal axes in parallel. Each piezoelectric column 61 has a first and second end face, which are substantially perpendicular to the longitudinal axis thereof. The organic material 2 is filled in the spaces between the piezoelectric columns 61 so as to expose the first and second end faces. The piezoelectric columns 61 are varied in diameter, and arranged only in the spaces between the upper and lower electrodes 39 (the spaces can be referred to "elements": portions to be driven by the upper and lower electrodes). Since the diameters of the piezoelectric columns 61 are different, these piezoelectric columns 61 can have different resonance frequencies, even when they have the same lengths. As a result, the composite piezoelectric transducer can have an enlarged frequency band to improve the image quality in an image observation apparatus in which the transducer is employed.

According to this embodiment, the piezoelectric columns 61 having different diameters are disposed below the electrodes 39 in each element, and in the regions between elements where no electrodes 39 are arranged, only the resin 2 is provided or no piezoelectric columns 61 is arranged. Such an arrangement of the piezoelectric columns 61 allows bending of the ultrasonic transducer around the soft resin 2 portion between the elements, so that a curved ultrasonic transducer can be manufactured without cutting at the portions between the elements.

Further, since the piezoelectric columns 61 are manufactured by means of etching, the columns 61 of desired configurations can be arranged in desired locations, which is impossible in the case where cutting such as dicing is employed. It is also possible according to this invention to manufacture narrow piezoelectric columns 61 of a 10 $\mu$m in diameter by means of etching.

Figure 8A:
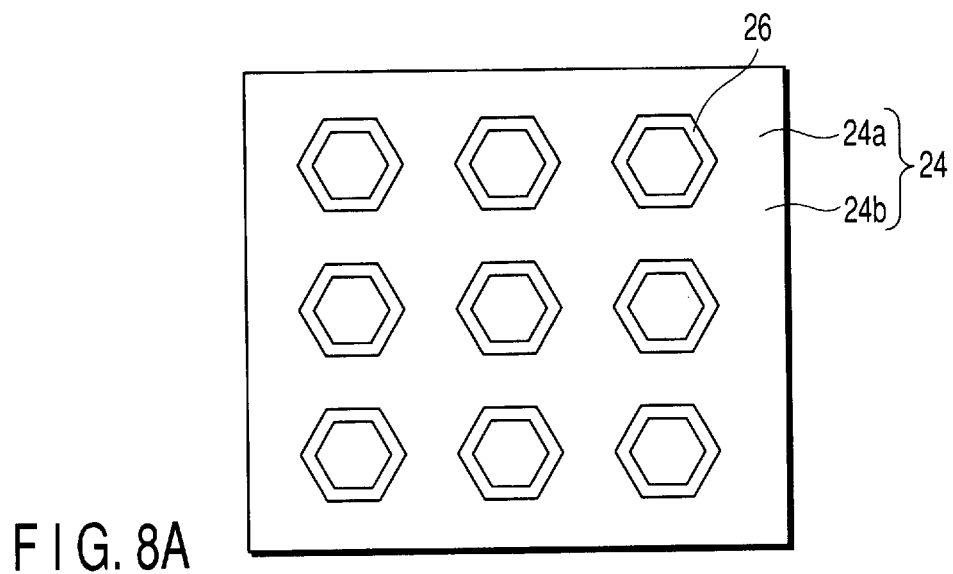
FIGS. 8A and 8B are plan views schematically illustrating one example of the piezoelectric substance on which a mask is formed according to this invention.
Figure 8B:
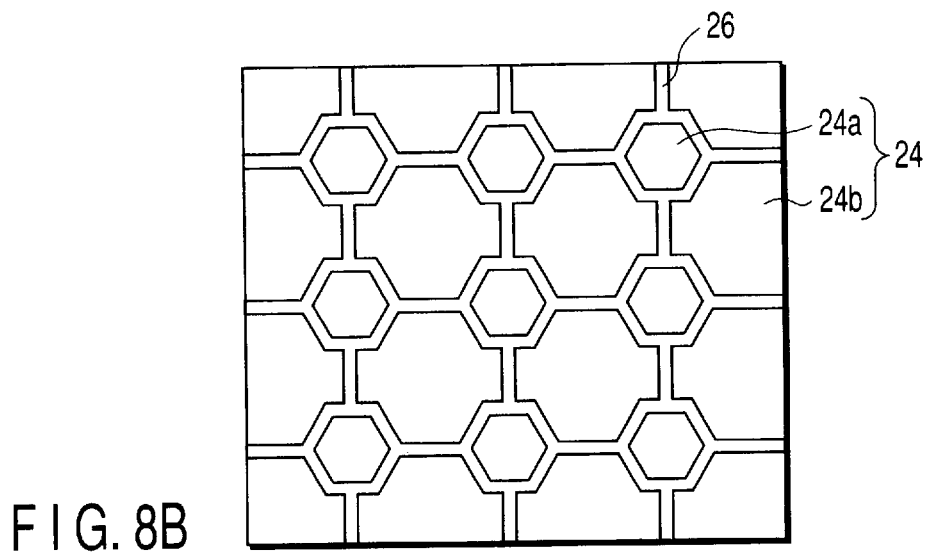

According the embodiment shown in FIG. 7, each of the piezoelectric columns 61 is formed into a cylindrical configuration. However, the piezoelectric columns 61 may be hexagonal or any other polygonal configuration in cross-section as shown in FIG. 8A. FIGS. 8A and 8B show respectively a plan view representing one example of piezoelectric substance bearing thereon a nickel mask 24. The nickel mask 24 is partitioned, by the intervention of the aperture portion 26, into a mask portion 24a corresponding to the piezoelectric column 61 to be left remained as shown in FIG. 6B and a mask portion 24b corresponding to the piezoelectric substance portion 62 to be removed. As described above, the mask portion 24a may be formed to have a hexagonal or any other polygonal configuration in cross-section as shown in FIG. 8A. Further, the piezoelectric columns 61 may be arranged irregularly. For the purpose of reducing the transverse vibrations that may cause a noise, it is preferable to make the distance between the neighboring piezoelectric columns 61 non-uniform.

In order to facilitate the removal of the redundant segments (the piezoelectric substance portion 62) of the piezoelectric block, a slit (aperture portion) 26 of a width of several micrometers partitioning the piezoelectric portion 62 into a plurality of sub-portions may be formed in advance in the mask portion 24a. Such a slit 26 is effective in improving the yield.

Since the fine working is performed by means of a dry etching, it is now possible to easily work a single crystal piezoelectric substance (it is difficult to apply a mechanical working such as dicing to this single crystal piezoelectric substance, and it is impossible to apply a lost mold process utilizing LIGA, etc. to this single crystal piezoelectric substance).

Further, since a piezoelectric structure prepared through the etching of a single crystal piezoelectric substance is utilized, it is now possible to manufacture a composite piezoelectric transducer which is very excellent in piezoelectricity. Therefore, the ultrasonic probe prepared by making use of this composite piezoelectric transducer would exhibit an improved S/N ratio, thereby making it possible to achieve a high resolution.

Although an array type transducer where the electrode is partitioned has been explained in this embodiment, the transducer is not confined to such an array type one. Namely, this invention is also applicable to a transducer provided with a pair of electrodes on both surfaces thereof, or to an annular array where the electrode is partitioned annularly.

Next, a third embodiment according to this invention will be explained with reference to FIGS. 9A, 9B, 10A and 10B. The same members or elements as those in the first embodiment will be identified by the same reference numerals, and hence, only the different features from the first embodiment will be mainly explained.

The manufacturing method according to this embodiment is fundamentally the same as that in the first embodiment illustrated in the steps shown in FIGS. 1A to 1M except that a piezoelectric ceramic Pb(Zr, Ti)O$_3$ plate is employed for the piezoelectric block 25 and a plural of grooves are formed on the ceramic plate to prepare a composite piezoelectric substance of 2-2 structure (the piezoelectric bodies and the resin elements both are two-dimensionally extending).

Namely, the piezoelectric block 25 is prepared, and an underlying layer for forming electrodes is formed on one surface of the piezoelectric block, after which a resist is coated and subjected to the steps of patterning exposure and development. Then, a nickel layer is deposited thereon by means of plating, and the resist layer is removed to form a nickel mask. Thereafter, a sacrificial layer 35 and an etch-stop layer 36 are formed on the other surface of the piezoelectric block, after which a supporting substrate 37 is bonded to the other surface of the piezoelectric block 25, thereby making it ready for the plasma etching step.

Then, the piezoelectric block 25 is subjected to an etching process employing a parallel plate RIE (reactive ion etching) method to thereby manufacture a plurality of piezoelectric columns 61 and 62 as shown in FIG. 1J. Subsequently, the resist layer 35 is etched away to thereby remove the redundant segments (piezoelectric substances 62) of the piezoelectric block 25 are removed. Thereafter, the grooves 27 are filled with the resin 2 in the same manner as explained in the first embodiment, which is followed by the step of abrasion to a desired thickness and the steps of providing electrodes and executing the poling, as shown in FIG. 1M.

Figure 9A:
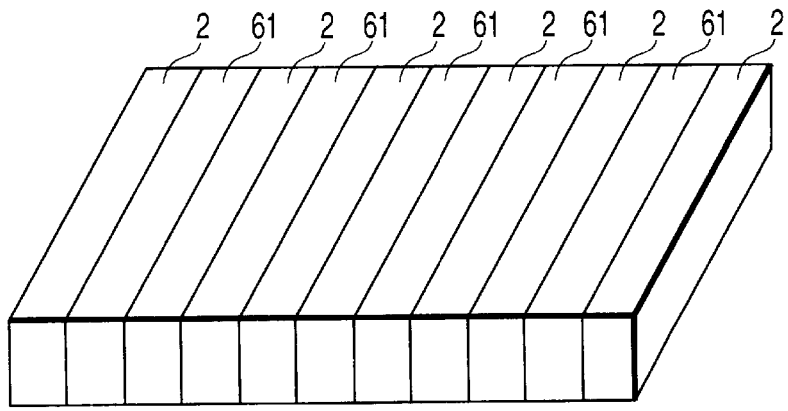
FIGS. 9A and 9B are perspective views schematically illustrating, respectively, one example of a composite piezoelectric substance of 2-2 structure and one example of cutting positions to form an array of piezoelectric rods according to this invention.

FIG. 9A shows a perspective view schematically illustrating one example of the composite piezoelectric transducer of 2-2 structure which has been prepared as described above. The electrodes are omitted in FIG. 9A.

Figure 9B:
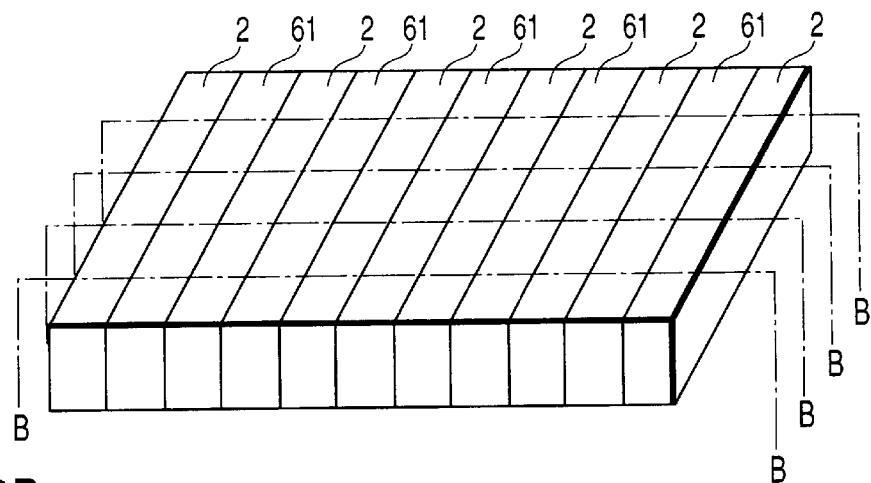

After providing a backing material or an acoustic matching layer, the composite piezoelectric transducer of 2-2 structure shown in FIG. 9A is cut along the line B perpendicular to the longitudinal direction to form an array as shown in FIG. 9B, thereby obtaining almost the same structure as that of the composite piezoelectric transducer of 1-3 structure shown in FIG. 7.

Figure 10A:
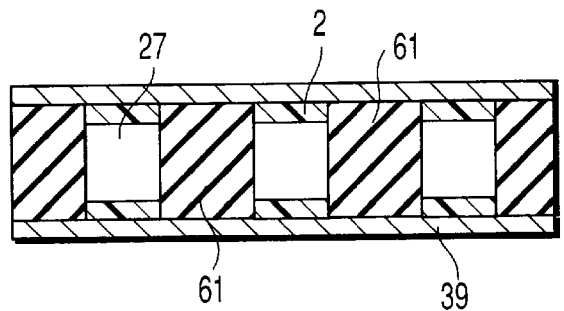
FIGS. 10A and 10B are cross-sectional views schematically illustrating one example of the composite piezoelectric substance according to this invention.

As shown in FIG. 10A, as long as at least part of the spaces 27 such as the groove and hole is filled with the resin 27, it is possible to obtain the properties demanded of the composite piezoelectric transducer. This partial filling of the resin 2 in the spaces 27 can be performed in such a way that the surface of a separately prepared resin 2 is brought into contact with the opening of the spaces 27 where the resin is not filled as shown in FIG. 1K, thereby filling the resin 2 only in the vicinity of the opening of the spaces 27. Thereafter, the sample is abraded and, electrodes are provided thereto to obtain a composite piezoelectric transducer in which the resin 2 is partially filled as shown in FIG. 10A. The air left within the spaces 27 as shown in FIG. 10A can minimize the cross-talk between the piezoelectric columns 61 and can lower the acoustic impedance to enhance the permeability of sound into human body, as described above. Therefore, the image quality can be improved in the ultrasonic diagnostic apparatus wherein this composite piezoelectric transducer is employed.

Figure 10B:
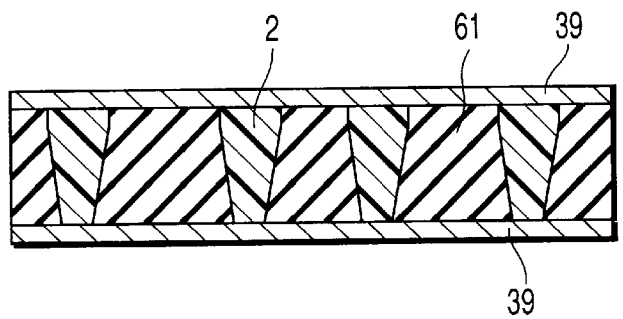

As described above, the etching may be performed so as to provide a tapered sidewall to the piezoelectric substance by changing the etching conditions. Thus, it is possible to provide a probe of enhanced S/N ratio and hence, enhanced sensitivity. FIG. 10B shows one example of the composite piezoelectric transducer comprising arrayed piezoelectric columns 61 which are tapered and varied in size. The provision of tapering to the sidewall of piezoelectric substance is also effective to the aforementioned first and second embodiments.

Although three kinds of embodiment are explained above, the constituent elements of these embodiments can be variously modified. Typical examples of such modifications will be illustrated as follows.

The piezoelectric columns 61 all having the same height are manufactured at first, and after the organic material 2 is filled therein, one or both surfaces of the piezoelectric columns 61 are abraded or polished so as to obtain a composite piezoelectric transducer having a convex or concave surface or surfaces.

A plurality of piezoelectric substances 1 may be manufactured in such a manner that at least one of the piezoelectric substances 1 differs in diameter from that of the other piezoelectric substances 1.

A plurality of piezoelectric bodies 1 may be manufactured in such a manner that at lease one of the piezoelectric substances 1 differs in length from that of the other piezoelectric substances 1. Thus, it would become possible to manufacture a composite piezoelectric transducer wherein only one surface thereof is formed into a convex surface or a concave surface. Alternatively, it would become possible to manufacture a composite piezoelectric transducer wherein both surfaces thereof are formed into a convex surface or a concave surface.

It is also possible to combine the aforementioned two methods; the method of forming the piezoelectric substances 1 in the manner that at least one of the piezoelectric substances 1 differs in diameter from that of the other piezoelectric substances 1, and the method of forming the piezoelectric substances 1 in the manner that at least one of the piezoelectric substances 1 differs in length from that of the other piezoelectric substances 1.

Of course it is also possible to further change or modify each constituent feature of the aforementioned various embodiments of this invention.

Although this invention has been explained based on the aforementioned embodiments, this invention also includes the following features.

A method of working a block-shaped piezoelectric block by means of plasma etching which is featured in that the etching work of the piezoelectric block is performed by making use of an apparatus comprising a high-frequency power source which is capable of generating and maintaining plasma, and a low-frequency power source which is capable of applying a frequency of not more than 1 MHz to the stage.

A method of manufacturing a composite piezoelectric substance which comprises the steps of:
forming a mask of desired configuration at a desired portion of a piezoelectric substance formed of potassium niobate single crystal;
etching the piezoelectric substance by means of plasma;
removing redundant segments of the piezoelectric substance which have been separated in the etching step;
filling at least partially the spaces formed after the removal of the redundant segments of the piezoelectric substance with an organic material; and
providing electrodes to the composite piezoelectric substance.

As explained above, it is possible, according to this invention, to manufacture a fine and highly densified composite piezoelectric transducer. Further, since the piezoelectric substance to be removed by means of etching can be reduced, any damage can be minimized for an etching apparatus, a facility for removing exhaust and environments. Further, this invention is also applicable to a piezoelectric single crystal. Additionally, it is now possible to provide a fine and highly densified composite piezoelectric transducer which is excellent in adhesivity between the resin and the piezoelectric substance. As a result, it is now possible to improve the durability of the composite piezoelectric transducer, and when this composite piezoelectric transducer is employed in an ultrasonic probe, it becomes possible to provide an image which is excellent in sensitivity and resolution.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of working a piezoelectric substance, which comprises the steps of;
forming, on one surface of a piezoelectric block, an etching mask having an aperture which defines a boundary region between a first piezoelectric segment to be removed, and a second piezoelectric segment to be left remained,
forming, on the opposite surface of said piezoelectric block, a sacrificial layer which corresponds to said first piezoelectric segment to be removed and said boundary region,
etching said piezoelectric block in said boundary region to reach said sacrificial layer, and
eliminating said sacrificial layer to remove said first piezoelectric segment.

2. The method according to claim 1, wherein said piezoelectric block is etched by means of plasma etching.

3. The method according to claim 1, wherein said sacrificial layer is eliminated by means of etching.

4. The method according to claim 3, wherein said sacrificial layer is formed of Si, and said etching is performed using $XeF_2$.

5. The method according to claim 1, wherein said sacrificial layer is formed of an organic material.

6. The method according to claim 1, wherein a width of said mask aperture is 20 μm or less.

7. The method according to claim 1, wherein said piezoelectric block consists of three or more kinds of elements.

8. The method according to claim 7, wherein said piezoelectric block consists of a lead-containing piezoelectric single crystal or lead-containing piezoelectric ceramics, or a potassium niobate.

9. The method according to claim 1, which further comprises a step of forming an etch-stop layer on the opposite surface of said piezoelectric block having said sacrificial layer.

10. A method of manufacturing a composite piezoelectric substance, which comprises the steps of;
forming, on one surface of a piezoelectric block, an etching mask having an aperture which defines a boundary region between a first piezoelectric segment to be removed, and a second piezoelectric segment to be left remained,
forming, on the opposite surface of said piezoelectric block, an sacrificial layer which corresponds to said first piezoelectric segment to be removed and said boundary region,
etching said piezoelectric block in said boundary region to reach said sacrificial layer, and
eliminating said sacrificial layer to remove said first piezoelectric segment,
filling at least partially a space formed by the removal of said first piezoelectric segment with an organic material, and
forming, on said one surface and said opposite surface of said piezoelectric block, electrodes for driving said second piezoelectric segment left remained.

11. The method according to claim 10, wherein said piezoelectric block is etched by means of plasma etching.

12. The method according to claim 10, wherein said sacrificial layer is eliminated by means of etching.

13. The method according to claim 12, wherein said sacrificial layer is formed of Si, and said etching is performed using $XeF_2$.

14. The method according to claim 10, wherein said sacrificial layer is formed of an organic material.

15. The method according to claim 10, wherein a width of said mask aperture is 20 μm or less.

16. The method according to claim 10, wherein said piezoelectric block consists of three or more kinds of elements.

17. The method according to claim 16, wherein said piezoelectric block consists of a lead-containing piezoelectric single crystal or lead-containing piezoelectric ceramics, or a potassium niobate.

18. The method according to claim 10, which further comprises a step of forming an etch-stop layer on the opposite surface of said piezoelectric block having said sacrificial layer.

19. The method according to claim 18, which further comprises a step of bonding a supporting substrate to the opposite surface of said piezoelectric block having said etch-stop layer.

* * * * *